United States Patent [19]
Maruska

[11] Patent Number: 5,998,232
[45] Date of Patent: Dec. 7, 1999

[54] PLANAR TECHNOLOGY FOR PRODUCING LIGHT-EMITTING DEVICES

[75] Inventor: H. Paul Maruska, Acton, Mass.

[73] Assignee: Implant Sciences Corporation, Wakefield, Mass.

[21] Appl. No.: 09/231,689

[22] Filed: Jan. 14, 1999

Related U.S. Application Data

[60] Provisional application No. 60/071,619, Jan. 16, 1998.

[51] Int. Cl.$^6$ ..................................................... H01L 21/00
[52] U.S. Cl. ................................ 438/46; 438/29; 438/45; 257/13; 257/21; 257/615; 257/745; 257/189
[58] Field of Search ................................. 438/45, 46, 29; 257/13, 21, 615, 745, 189

[56] References Cited

U.S. PATENT DOCUMENTS

| | | |
|---|---|---|
| 4,594,603 | 6/1986 | Holonyak, Jr. . |
| 5,321,713 | 6/1994 | Khan et al. . |
| 5,408,120 | 4/1995 | Manabe et al. ........................ 257/431 |
| 5,563,422 | 10/1996 | Nakamura et al. ...................... 257/13 |
| 5,578,839 | 11/1996 | Nakamura et al. ...................... 257/96 |
| 5,587,593 | 12/1996 | Koide et al. ............................. 257/94 |
| 5,648,295 | 7/1997 | Otoma et al. . |
| 5,893,722 | 4/1999 | Hibbs-Brenner et al. ............... 438/45 |

Primary Examiner—Wael Fahmy
Assistant Examiner—Long Pham
Attorney, Agent, or Firm—Foley Hoag & Eliot LLP

[57] ABSTRACT

The present invention relates to a novel planar technology approach utilizing ion implantation to improve the fabrication procedure for manufacturing nitride light-emitting and laser diodes. The simplified processing significantly reduces the costs of manufacturing these devices and allows flip-chip bonding to be used for efficient heat removal, yielding much brighter LEDs and more powerful lasers.

20 Claims, 10 Drawing Sheets

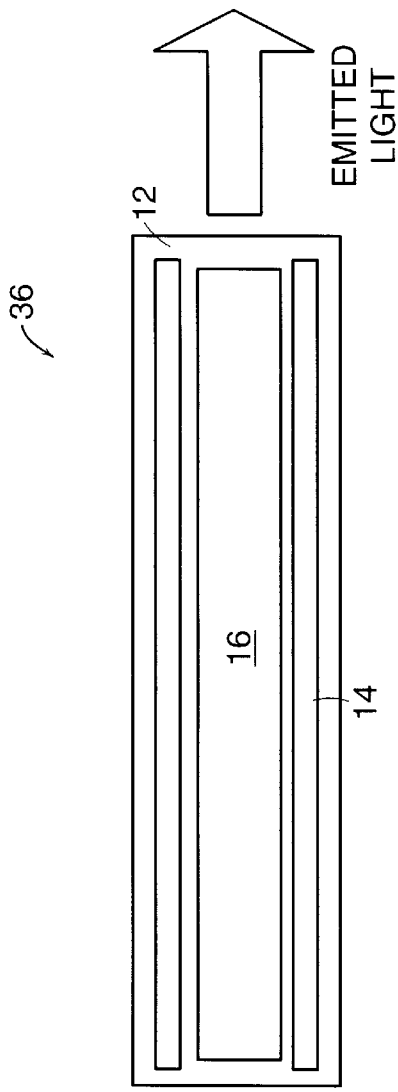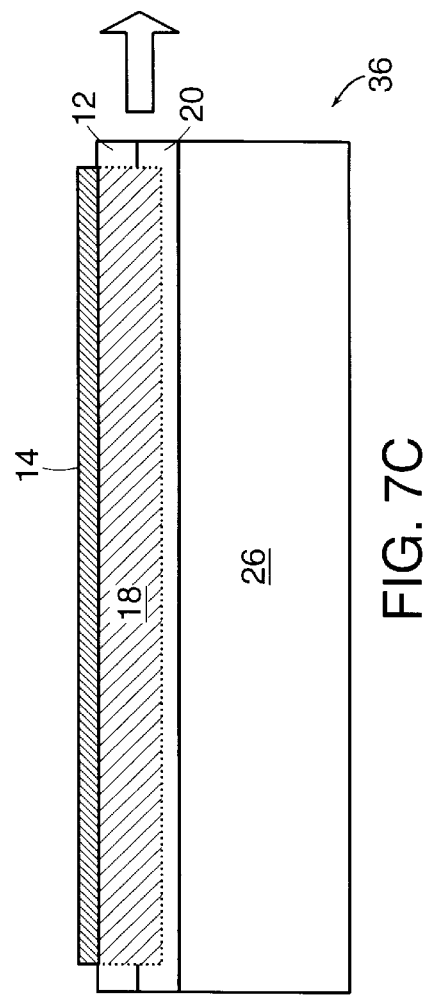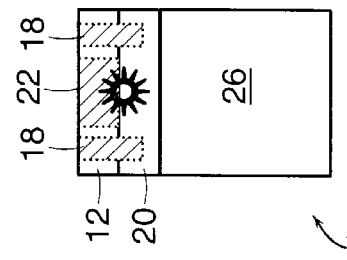

PLANAR TECHNOLOGY FOR PRODUCING LIGHT-EMITTING DEVICES

This application claims the benefit of U.S. Provisional application Ser. No. 60/071,619 filed Jan. 16, 1998.

BACKGROUND OF THE INVENTION

1. Field of the Invention

The present invention relates to a method of introducing impurities into crystalline films of nitride-based compound semiconductor structures, and more particularly to a method of preparing high brightness visible and ultraviolet light-emitting devices featuring a planar top surface.

2. Description of Prior Art

Blue and green light-emitting diodes (LEDs) based on nitride semiconductors (e.g., gallium nitride (GaN), aluminum nitride (AlN), and indium nitride (InN)) have reached brightness levels which are comparable to traditional red and orange LEDs based on arsenide and phosphide semiconductor technologies. Brightness levels now exceed one candela in the blue, and have reached ten candelas in the green. Brightness is becoming high enough that soon these nitride LEDs will find general use throughout the commercial sector, for applications such as indicator lights, large flat panel displays, and traffic signals. Furthermore, purple diode lasers based on gallium nitride have recently been demonstrated which could provide four times the storage density now available for optical disks, which could enable secure satellite communications links to be created, and which could be used for medical diagnoses and therapies. However, techniques for fabricating nitride LEDs rely on complex technology for device fabrication which results in costs that are much higher than those encountered with the manufacture of standard red and orange LEDs, and laser diodes.

Most nitride semiconductor devices are prepared by metal-organic chemical vapor deposition (MOCVD). A series of thin films with different nitride compositions, and which contain minor concentrations of impurities (dopants) for controlling the electric current and the wavelength of the emitted light, are grown sequentially on a heterogeneous sapphire substrate. It is necessary to make two electrical contacts to any light-emitting or laser diode device, one to supply electrons to the n-type region, and the other to remove electrons from the p-type region. It is always necessary to grow the n-type region first, starting at the interface with the substrate, and the p-type region last, at the top surface. Unfortunately, sapphire is an electrical insulator, and thus a bottom contact to the substrate is not possible. Reactive ion etching has been used to bore a hole through the p-type layers and any possible undoped (intrinsic) layers to allow the placement of a metal contact to the top surface of the rear n-type region. This approach is costly and creates a non-planar surface. A metal film contact must be selectively deposited into the hole, without making contact with the sidewalls of the hole, and a wire must be bonded to this metal pad. A second metal film must be evaporated over the remainder of the top surface to form the contact to the p-type layer. The electron current must then flow laterally from the lower contact to the n-type rear layer and spread uniformly under the entire device before turning vertically to travel up through the active region to the top metal contact. If the current doesn't first spread uniformly throughout the entire n-type layer, then the current density passing up through the active region will not be uniform, and not all of the volume of the material will generate the same brightness.

This problem can be seen by referring to U.S. Pat. No. 5,321,713, dated Jun. 14, 1994 (Khan et al) where FIGS. 2 and 3 shows GaN-based laser diodes which feature a second contact to the rear n-type layer placed down in an etched hole. In U.S. Pat. No. 5,408,120, dated Apr. 18, 1995, Manabe et al. show an aluminum metal plug which has been used to fill the hole that was etched in a GaN LED to form a contact to the rear n-type layer (FIG. 1). In U.S. Pat. No. 5,563,422, dated Oct. 8, 1996, Nakamura et al. describe a method of making electrical contacts to a GaN light-emitting device on two different levels, as shown in FIG. 1 therein. In U.S. Pat. No. 5,578,839, dated Nov. 26, 1996, Nakamura et al. again show in FIGS. 1, 11, 12 the GaN-based light-emitting structure where metal electrode 24 is deposited on a ledge after etching. Koide et al in U.S. Pat. No. 5,587,593, dated Dec. 24, 1996, show a method for etching a hole through the p-type layer 6 and light-emitting layer 5 down to the n-type layer 4 and filling the hole with nickel metal 8 to make the contact, as shown in FIG. 1. It is clear that many workers have come up with similar schemes involving etched holes to allow an electrical contact to be made to the rear n-type contact.

To allow for the presence of the non-conducting transparent sapphire substrate, nitride devices have been mounted substrate-down on a chip carrier, with wire bonds attached at two different levels on the top, complicating the assembly process. Two wires must be bonded at two different levels at or near the top surface of the device. Heat must be removed through the sapphire substrate which offers very poor thermal conduction. This heating problem is especially detrimental to laser performance and longevity. For an LED, light must be emitted through the top surface metal contact, reducing brightness. Also, one half of the light travels down through the sapphire substrate and is lost by absorption in the chip carrier. (See especially U.S. Pat. No. 5,563,422, FIG. 1.)

In contrast, most silicon devices are formed by a planar process which consists of the selective introduction of dopant atoms into small areas of the silicon wafer from the top surface of the wafer in order to form regions of n-type and p-type material. This technology is called planar because fabrication is accomplished by processes carried out from one surface plane. The crucial advantage of planar technology is that each portion of the fabrication process is applied to every device on the entire wafer at the same time. Attachment of leads is simplified when all contact pads are on the same plane, rather than located in holes below the surface. Gallium-arsenide (GaAs)-based LEDs and lasers are grown on a conducting substrate, which substrate forms one of the contacts after metallization. This contact can be fashioned as a mirror to reflect light back out through the top surface, doubling the brightness. Only one contact is needed on the top surface, which remains planar. For a GaAs laser, the chip is always flipped over and the p-type top growth surface is soldered to a heat sink, so that it is not necessary for the heat that is generated in the device to be extracted slowly through a substrate which is a poor thermal conductor.

In a recently reported technique, n-type conductivity was reported after implants of $Si^+$ and p-type conductivity after implants of $Mg^+P^+$ in nominally undoped samples of GaN films (Pearton et al., (1995) *Appl. Phys. Lett.,* Vol 67, pp. 1435–1447). They found that $Mg^+$ implantation (dose=5× $10^{14}$ cm$^{-2}$, 180 keV) did not produce p-type conductivity; but $Mg^+P^+$ co-implantation produced p-type conductivity when samples were annealed at 1050–1100° C. Also, implantation of $Si^+$ gave a two order of magnitude increase in conductivity after annealing above 1000° C.

$^{40}$Ca or $^{16}$O were implanted each with a dose of $5\times10^{14}$ cm$^{-2}$ at energies of 180 and 70 keV, respectively, to place the ion peak 100 nm below the surface of two separate GaN films (Zolper et al., (1996, *Appl. Phys. Lett.,* Vol, 68, pp. 1945–1947). Samples were annealed for 10–15 sec in flowing N$_2$ between 900 and 1150° C. Ca became activated at 1100° C. even without any co-implant specie and gave indications of p-type conductivity. Implanted O ions were also found to be activated, giving n-type conductivity. A GaN junction field-effect transistor that was created by ion implantation of Ca has been reported (Zolper et al., (1996), *Appl. Phys. Lett.,* Vol 68, pp. 2273 2275).

SUMMARY OF THE INVENTION

The present invention comprises a method of applying planar technology to a manufacturing process for light-emitting diodes or laser diodes using ion implantation to introduce dopants through the top surface. To prepare a device according to the present method, a conventional series of nitride films is deposited upon a substrate. The nitride films may be grown by any acceptable procedure for depositing such films, for example, by a MOCVD or MBE process, but the final surface layer is prepared without any intentional addition of dopants.

The present invention comprises a method for producing semiconductor LEDs or laser diodes (LDs) using planar technology and ion implantation. The method comprises the following general steps:

(a) providing a transparent substrate having disposed sequentially thereon:
  (i) an n-type rear layer comprising a nitride compound doped with n-type dopants,
  (ii) at least one additional layer, which may or may not be doped, comprising a nitride compound, nitride alloy or combination thereof, and
  (iii) a final, topmost undoped layer comprising a nitride compound, nitride alloy or combination thereof;
(b) applying n-type dopants to the layered substrate by an ion-implantation procedure, wherein the device is shielded by a first mask which permits the n-type dopants to become implanted into the layers only in the unmasked areas, thereby forming a conductive channel through the layered structure; and
(c) applying p-type dopants using ion-implantation to the topmost layer using a second mask such that the p-type dopants become implanted into the topmost layer in the unmasked areas, thereby forming a p-type region.

The selectively doped structure formed by this process then can be further processed to form the finished LED or LD.

The substrate may be any transparent or translucent material suitable for use in LEDs or LDs. Exemplary materials which are useful for this purpose include sapphire, spinel or silicon carbide. Ions effective n-type dopants include silicon (Si), germanium (Ge), sulphur (S) and oxygen (O), for example. In the present methods, an ion specie from this group, which can impart n-type conductivity to a nitride semiconductor, is implanted through a specific mask under conditions which result in the ions becoming implanted into the undoped surface nitride layer and through the active region at the junction to form a vertical channel. This channel provides a shunting path from the top surface to the rear n-type nitride layer which will function as an electrical contact. This n-type implantation step preferably is carried out to form a pattern at the periphery of the device to insure a uniform spread of the current throughout the rear n-type region. Ions which can provide p-type conductivity for nitride layers include beryllium (Be), magnesium (Mg), calcium (Ca), carbon (C), and zinc (Zn). The nitride materials used to form the various layers may comprise any appropriate nitride compounds, alloys or mixtures thereof useful for forming semiconductor devices. For example, nitride compounds or alloys formed from nitrogen and the elements from Groups IIIA and IIIB in the Periodic Table of the Elements can be used. Preferred nitride materials include gallium nitride, aluminum nitride, indium nitride, thallium nitride, scandium nitride, yttrium nitride, lanthanum nitride, and any alloys, mixtures and combinations of these.

Optionally, a co-implant element may be used during step (c) to assist the incorporation of the p-type ion into the lattice. For example, if either nitrogen or phosphorus is implanted into the sample in the same region as the p-type dopant, such ions will be readily incorporated on the existing nitrogen sub-lattice thereby expanding this lattice and creating vacancies on the gallium sub-lattice. The p-type dopant then can fill the vacancies which are simultaneously created on the gallium sub-lattice.

After the implantation procedures are completed, the resulting wafer undergoes an annealing step. The wafer is placed in an appropriate furnace, preferably in an ambient of flowing inert gas. In one embodiment, the furnace is operated at an elevated temperature of at least 1000° C., and the wafer is disposed in the heated furnace. In another embodiment, the wafer first is disposed in a cold furnace which then is brought up to the desired temperature.

The wafer formed by the present methods contains multiple LEDs or LDs. Each LED or LD on the wafer is substantially identical, and each is produced by an ion implantation procedure. The ions which are implanted define a central p-type doped region and an n-type doped border region for each device on the wafer. The n-type surface channel preferably is in the form of a band, ring or other pattern around the periphery of the device, and the p-type implant preferably is targeted for a region between or within the bands, ring or pattern.

After the annealing step, the wafer containing a plurality of the layered semiconductor devices described above can be further processed to form LEDs or LDs. For example, to make an LED, metal contacts are formed according to well-established protocols on the surface plane of the wafer on the n-type and p-type implanted regions. After the deposition of a metal contact on each central p-type portion and each n-type border portion, solder can be deposited on each metal contact. Finally, the wafer is cut apart to separate each LED into a separate "chip." Each chip typically is square in shape, although fabrication of other shapes is possible using similar techniques. The chip is flipped over so that the transparent substrate faces upward, and the contacts are soldered to a lead frame. Upon application of electrical energy, light is emitted upward through the substrate. LDs can be constructed in a similar manner, except that the chips typically are rectangular in shape, and dielectric mirrors are placed on the narrow ends of the rectangular chip such that upon application of electrical energy, light is emitted through one or both of the narrow ends of the LD.

In a currently preferred embodiment of the present invention, there is provided a method for fabricating a gallium nitride-based Group III-V compound semiconductor device, comprising the following steps.

In the first step of the procedure, a substrate is provided having disposed thereon a stack of semiconductor layers including a low temperature AlN or GaN buffer layer, an n-type GaN rear contact layer, an n-type Al$_x$Ga$_{1-x}$N (wherein $0 \leq x \leq 1$) lower cladding layer, an undoped active layer comprised of one or more alloys of $In_yGa_{1-y}N$ (wherein $0 \leq y \leq 1$) which may be in the form of quantum wells, a p-type $Al_xGa_{1-x}N$ upper cladding layer, and an undoped GaN front surface contact layer.

In the second step, n-type dopants are introduced by ion implantation of selected ions under conditions sufficient to form a vertical channel which permeates through the topmost surface layer and the intervening layers to the rear n-type layer which is disposed directly upon the substrate. As stated above, ions such as silicon, germanium, sulphur and oxygen are effective n-type dopants for GaN.

In the third step, a region of the undoped surface layer is imparted with p-type conductivity. As stated above, ions such as beryllium, magnesium, calcium, carbon, and zinc can provide p-type conductivity for GaN layers under conditions sufficient to implant the p-type dopants into the surface layer only. A second mask is used to define the region to be rendered p-type.

The ion implantation approach provides a simplified packaging strategy resulting in higher yields, LED devices which are twice as bright, and lasers which have cooler operation. The use of the present planar technology in the fabrication of gallium nitride light-emitting and laser diodes can significantly reduce the costs of manufacturing of these devices and allow flip-chip bonding for efficient heat removal.

BRIEF DESCRIPTION OF THE DRAWINGS

FIG. 7A is a top view diagram showing the structure of a laser diode.

FIG. 7B is an end view diagram showing the structure of the laser diode of 7A.

FIG. 7C is a cross-sectional view diagram showing the structure of the laser diode of 7A.

DETAILED DESCRIPTION OF THE INVENTION

Figure 1A:
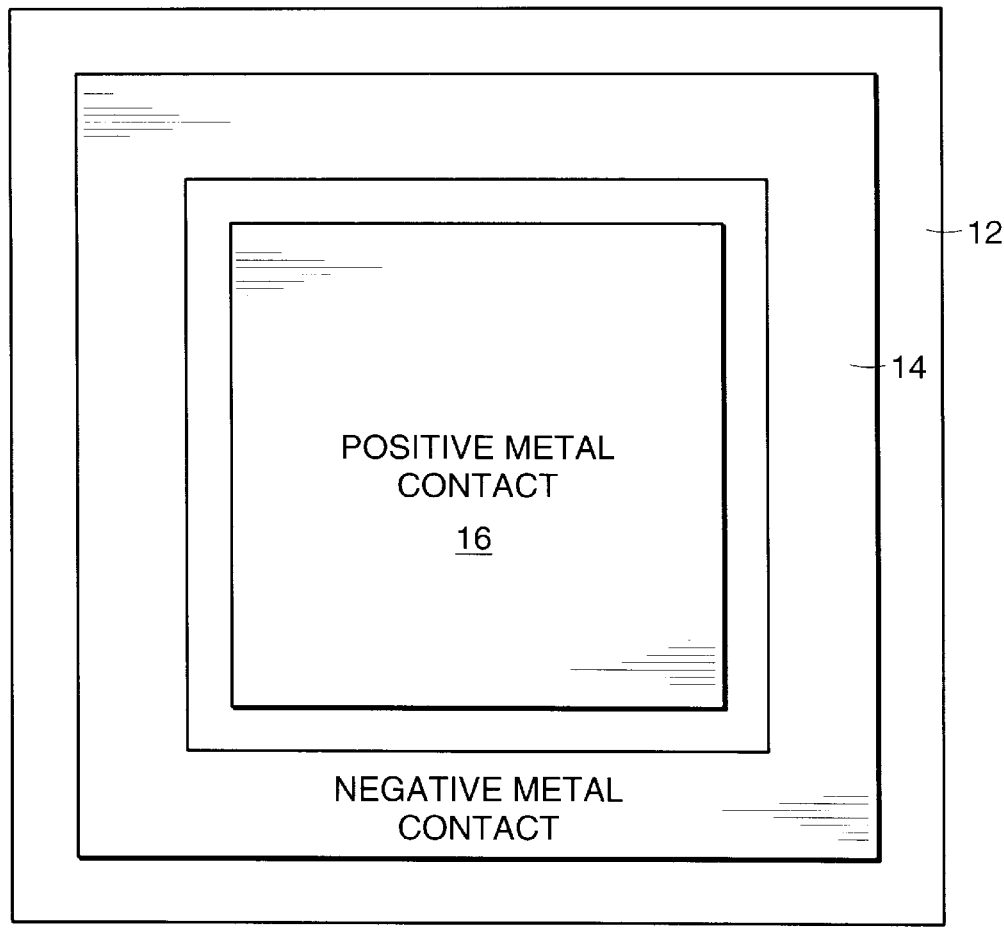
FIG. 1A is a top view diagram showing the structure of the LED embodied in Example 1.

The present invention comprises a method for producing semi-conductor LEDs and LDs using planar technology and ion implantation. The method comprises the following general steps:

(a) providing a transparent substrate having disposed thereon:
   (i) an n-type rear layer comprising a nitride compound doped with n-type dopants,
   (ii) at least one additional layer, which may or may not be doped, comprising a nitride compound, nitride alloy or combination thereof, and
   (iii) a final, topmost undoped layer comprising a nitride compound, nitride alloy or combination thereof;
(b) applying n-type dopants to the layered substrate by an ion-implantation procedure, wherein the device is shielded by a mask which permits the n-type dopants to become implanted into the layers only in the unmasked areas thereby forming a conductive channel through the layered structure; and
(c) applying p-type dopants to the topmost layer by an ion-implantation procedure, wherein the device is shielded by a mask such that the p-type dopants become implanted into the topmost layer in the unmasked areas, thereby forming a p-type region.

The substrate may be any transparent or translucent material suitable for use in semiconductor LEDs or LDs. Exemplary materials which are useful for this purpose include sapphire, spinel or silicon carbide. "Spinel" refers to a group of minerals having the general formula $AB_2O_4$ wherein A is magnesium, ferrous iron, zinc, manganese or a combination thereof, and B is aluminum, ferric iron, chromium, or a combination thereof. Sapphire is the currently preferred substrate material.

The rear n-type layer disposed on the substrate can be any suitable nitride material containing n-type dopants. For example, nitride compounds or alloys formed from nitrogen and the elements from Groups IIIA and IIIB in the Periodic Table of the Elements can be used. Preferred materials include gallium nitride, aluminum nitride, indium nitride, thallium nitride, scandium nitride, yttrium nitride, lanthanum nitride, and any alloys, mixtures and combinations of these. Gallium nitride is the currently preferred material. The first or rear layer preferably has a thickness in the range of from about 1 $\mu$m to about 5 $\mu$m.

The additional nitride layers disposed upon the rear n-type layer can be formed from any suitable nitride material. The additional layers may or may not contain dopants. For example, nitride compounds or alloys formed from nitrogen and the elements from Groups IIIA or IIIB in the Periodic Table of the Elements can be used. Preferred materials include gallium nitride, aluminum nitride, indium nitride, thallium nitride, scandium nitride, yttrium nitride, lanthanum nitride, and any alloys, mixtures and combinations of these. Indium-gallium nitride is the currently preferred material. The rear layer and the additional layers can be grown according to well established procedures, for example, by metalorganic chemical vapor deposition (MOCVD) or by molecular beam epitaxy (MBE).

The topmost layer ("topmost" refers to the layer furthest removed from the substrate) comprises an undoped nitride layer. For example, nitride compounds or alloys formed from nitrogen and the elements from Groups IIIA and IIIB in the Periodic Table of the Elements can be used. Preferred materials include gallium nitride, aluminum nitride, indium nitride, thallium nitride, scandium nitride, yttrium nitride, lanthanum nitride, and any alloys, mixtures and combinations of these. GaN is the currently preferred material. The topmost layer also may be grown using established procedures such as MOCVD or MBE. The final undoped layer preferably has a thickness in the range of from about 0.25 to about 0.5 $\mu$m, and more preferably about 0.30 $\mu$m.

Elements which are useful as implantable n-type dopants are those which act as electron donors within the crystal structure. Ions such as silicon, germanium, sulfur or oxygen are effective n-type dopants for GaN. The concentration of the implanted n-type dopants preferably is in the range of from about $1\times10^{18}$ cm$^{-3}$ to about $5\times10^{18}$ cm$^{-3}$.

Elements which are useful as p-type dopants are those which act as electron acceptors within the crystal structure. Ions such as beryllium, magnesium, calcium, carbon, and zinc are effective p-type dopants for GaN-based structures. The p-type dopants preferably are co-implanted with another material, such as nitrogen or phosphorus, which is capable of assisting integration of the dopants into the nitride crystal lattice. The concentration of the implanted p-type dopants preferably is in the range of from about $5\times10^{18}$ cm$^{-3}$ to about $1\times10^{20}$ cm$^{-3}$.

In the present invention, ion implantation procedures are used to apply the dopants. Any suitable ion implantation technique can be used. Ion implantation is a well known process, and machines for performing ion implantation are commercially available.

For any type of dopant ion which is introduced in a nitride material, particularly GaN, it is beneficial to anneal the wafer after the ion implantation step. Annealing preferably is carried out at a temperature in excess of about 1000° C., and preferably at a temperature of from about 1125 to about 1175° C. Annealing preferably is performed for approximately 20 to 30 minutes to allow healing of the damage to the crystal lattice which was caused by the ion bombardment. Annealing also allows the implanted ions to assume correct positions within the crystal lattice. When heating GaN films to temperatures in excess of 1000° C., it is necessary to avoid damaging the surface of the top GaN layer to prevent evaporation of nitrogen atoms from the surface. A protective layer, which preferably is a nitride compound, may be coated over the surface to prevent decomposition. Examples of useful protective nitride films include AlN, BN, and $Si_3N_4$. After the annealing step is complete, this protective layer can be removed by an appropriate etching procedure. For example, the LED device can be grown by MOCVD or MBE as described above, and a protective layer comprising undoped AlN, about 100 to 150 $\mu$m thick, deposited on the topmost surface. The dopant ions can be implanted through this very thin layer of AlN, after which the wafer can be annealed. Subsequently, the AlN film can be dissolved by an etch of less than about 5 minutes duration in an aqueous solution of KOH (about 1 M) maintained at a temperature of about 60 to 70° C. It also is possible to return the wafer to the crystal growth reactor and deposit the thin film of protective AlN subsequent to the ion implantation procedure.

The wafer may be annealed by heating it to a temperature of at least about 1000° C. in an inert gas atmosphere. Preferably, the inert gas is nitrogen, and the heating step is carried out at a temperature of about 1125° C. to about 1175° C. for at least about 20 minutes, and more preferably for at least about 20 to 30 minutes.

After annealing, an electrical contact is disposed on each n-type and p-type region. The metal contacts are selected so that they form a highly reflective surface on the side facing the transparent substrate. Metals which are useful for this purpose include titanium followed by aluminum for n-type contacts, and titanium followed by gold, nickel or tungsten for p-type contacts. Solder regions then are deposited on each metal region. Finally, the wafer is cut apart to separate each LED or LD into a separate chip. Each chip then is flipped over and attached to a lead frame such that the transparent substrate faces upward. Upon application of electrical energy, the generated light is emitted upward through the substrate if the chip is an LED, or forward through one side if the chip is an LD.

Figure 1B:
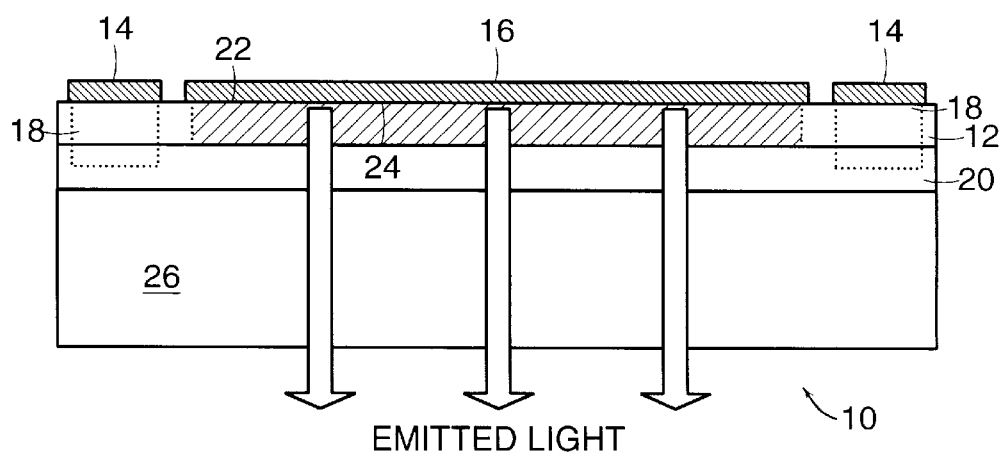
FIG. 1B is a cross-sectional view diagram showing the structure of the LED embodied in Example 1.

FIG. 1A shows a top view and FIG. 1B shows a cross-sectional view of a nitride-based light-emitting diode (LED) 10 of the present invention. FIG. 1A shows a top view of an LED device comprising a centrally located positive metal contact 16, surrounded by a peripheral negative metal contact 14 disposed on the topmost layer 12 of the semiconductor device. FIG. 1B is a side view of the device showing the transparent substrate 26 having disposed thereon a series of lower layers 20 (which are shown as one layer for convenience) and topmost layer 12. The topmost layer 12 and lower layers 20 have been ion-implanted with n-type dopants forming an n-type doped region 18 which extends through layers 12 and 20 and around the entire circumference of the device. An ion-implanted p-type region 22 has been formed in layer 12 the central region of the device. Negative metal contacts 14 are disposed upon the n-type region, and positive metal contact 16 is disposed upon the p-type region. The metal contacts 14 and 16 comprise highly reflective metal which forms a mirrored or reflective surface 24 facing toward the transparent substrate 26. As shown by the arrows in FIG. 1B, light generated upon applying energy to the device is emitted through the transparent substrate, and is reflected from the mirrored surface 24.

Figure 2:
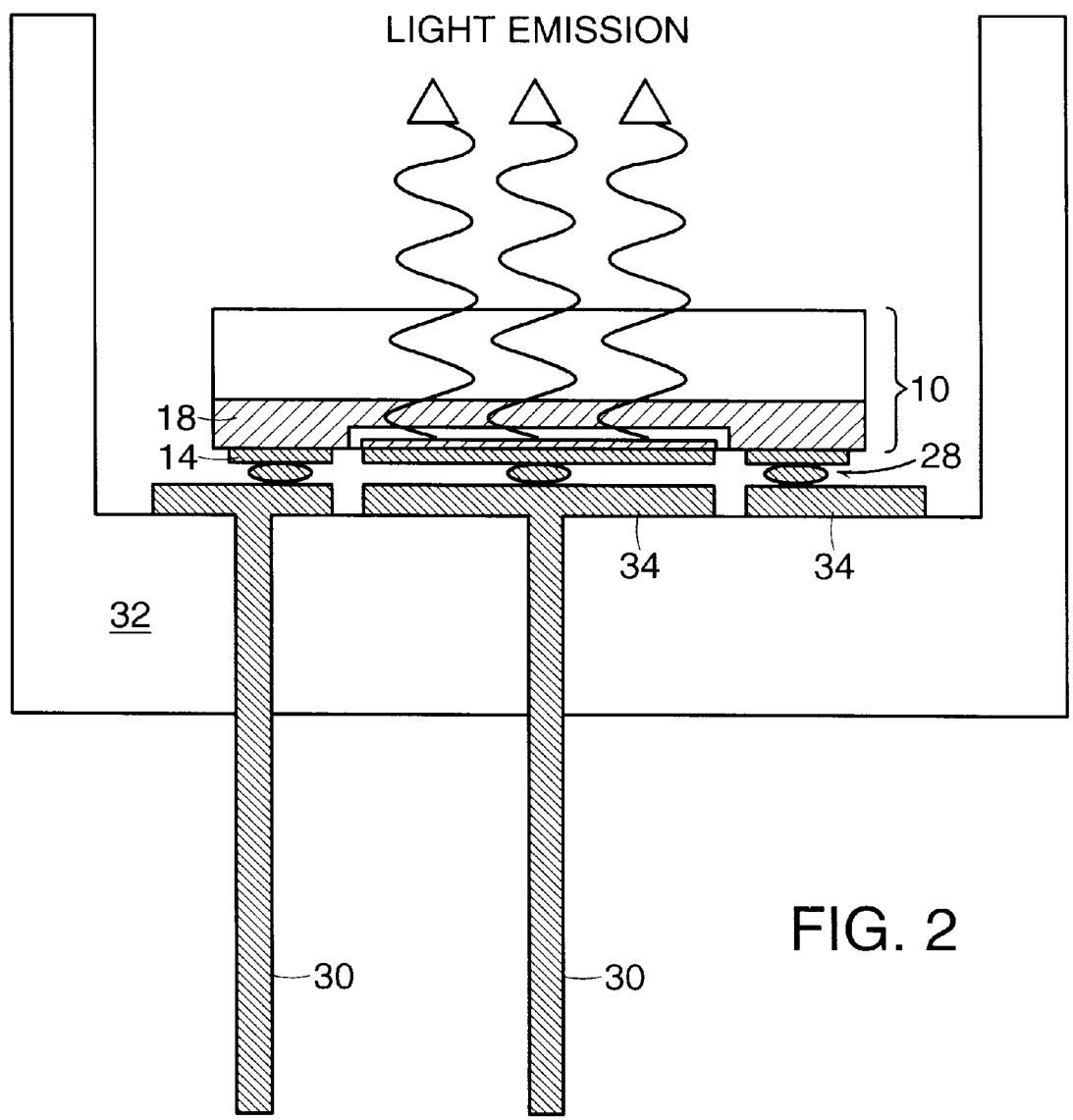
FIG. 2 is a diagram showing a cross-sectional view of the LED attached to a lead frame with light emitted upward through the transparent substrate.

FIG. 2 shows an LED utilizing a chip made according to the present invention. The LED 10 is joined via a solder bonds 28 to metal stripes 34. The metal stripes are disposed on a lead frame 32 and at least two of the metal stripes 34 are electrically connected to leads 30. When electrical energy is applied through leads 30, the resulting electrical current causes light to be emitted from the LED as shown by the arrows in FIG. 2.

Figure 3:
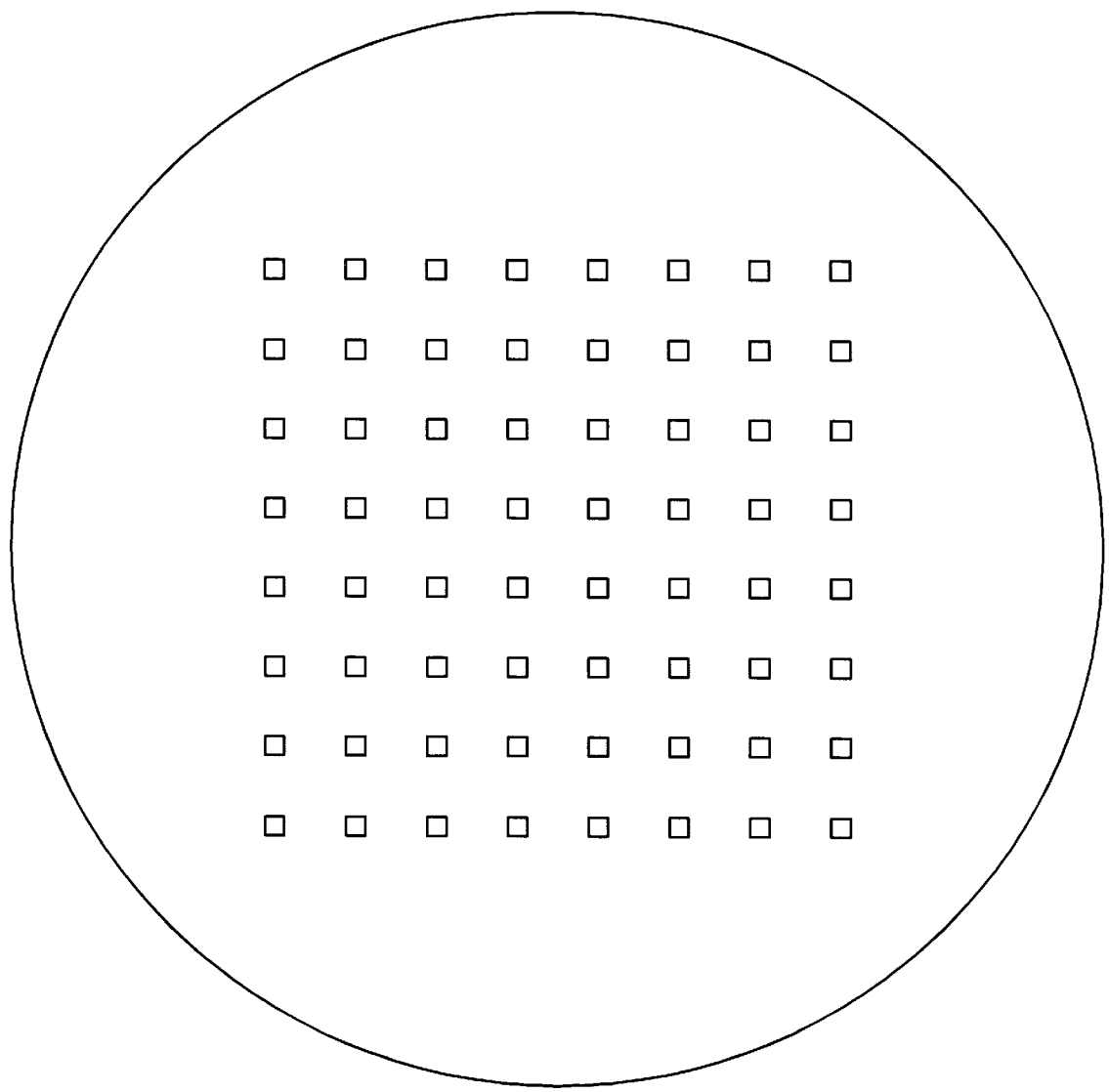
FIG. 3 is a diagram showing a top view of a photolithography mask suitable for defining the regions of the wafer into which the p-type dopant ions will be implanted.

The wafer must be properly masked in order that the implanted species enter only certain selected regions of the wafer. Masking can be accomplished by any appropriate procedure. In one embodiment, masking can be accomplished, for example, by first coating the entire wafer with a film of silicon dioxide ($SiO_2$). This film may be deposited by any convenient method, including, for example, evaporation, sputtering, or chemical vapor deposition. The film of $SiO_2$ should be at least about 1 $\mu$m thick to serve as an effective shield which can prevent ions from entering the topmost layer of nitride material. The $SiO_2$ film must be removed from regions where it is desired that the ions enter the nitride material. The surface of the $SiO_2$ film is coated with a photoresist, and the photoresist is exposed to ultraviolet light under conditions sufficient to induce a pattern in the photoresist. This pattern is created by placing a mask over the photoresist. An example of a mask suitable for defining a p-type implant region is shown in FIG. 3. A mask suitable for defining an n-type implant region is shown in FIG. 4.

Figure 4:
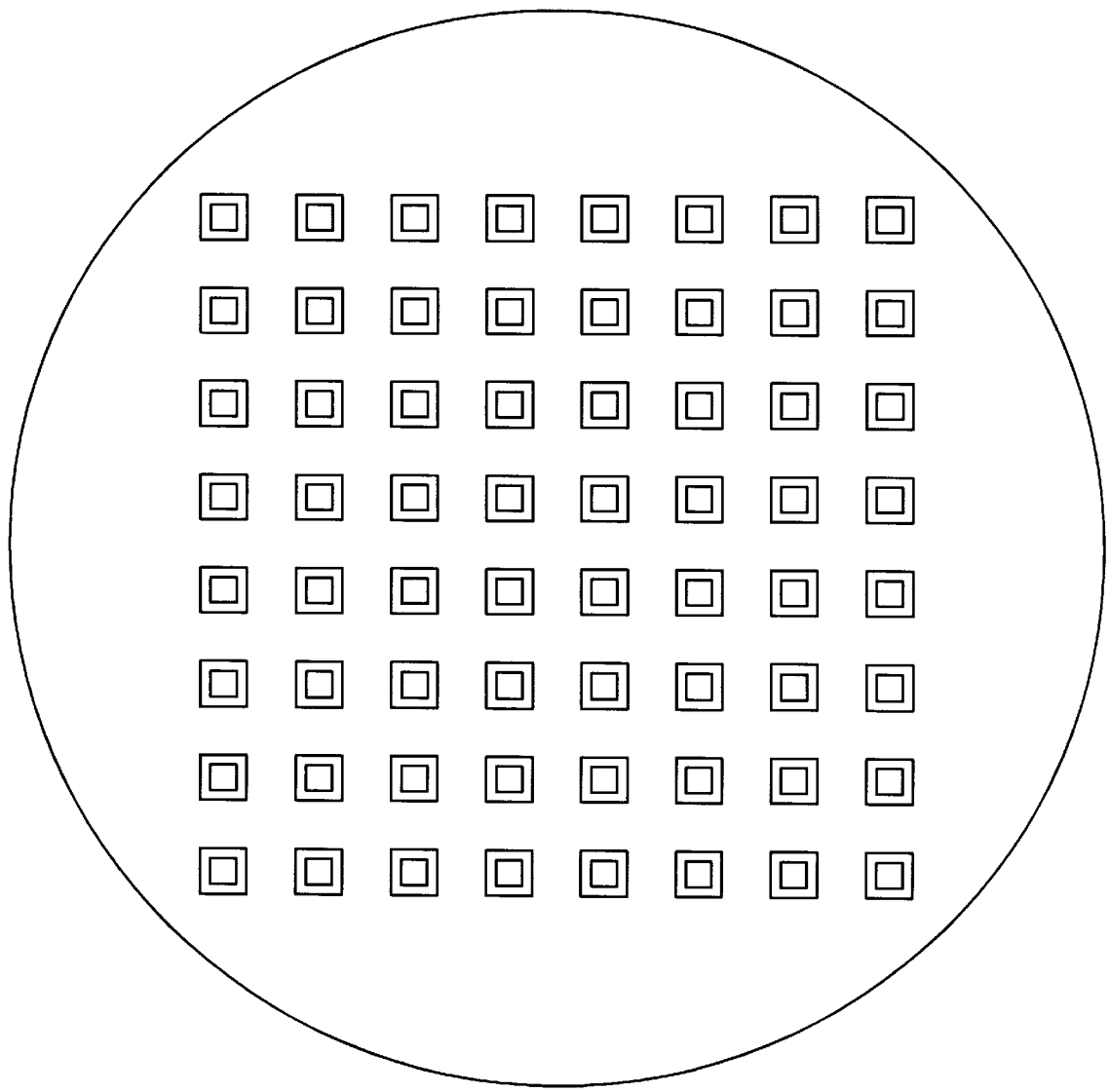
FIG. 4 is a diagram showing a top view of a photolithography mask suitable for defining regions of the wafer into which the n-type dopants will be implanted.

The masks shown in FIG. 3 or FIG. 4 will expose the photoresist to light only through the clear portion of the mask in such a manner that where it is exposed, the photoresist will be removed. The design of these masks is well known to those skilled in the art of making photolithography masks. The removal of the photoresist when exposed to light will leave a region of bare $SiO_2$ at each exposed position. Hydrofluoric acid or other etchant then can be used to etch away the regions of bare $SiO_2$. The regions which are no longer protected by the $SiO_2$ film will be accessible to the ion beam in the implantation machine. In regions where the $SiO_2$ film has remained in place, the ion beam will be trapped in the SiO$_2$ layer and therefore none of the ions will be able to enter the nitride layers.

Another embodiment of the present invention utilizes ion implantation to manufacture laser diodes (LDs). Such a device is one of many which are formed simultaneously upon a substrate according to the procedures described herein. The wafer is processed such that it will contain a multitude of LDs, each substantially identical to the others. Each LD is prepared using an ion implantation procedure as described herein. The ions which are implanted define a central elongated rectangle-shaped p-type doped region, and two n-type doped peripheral stripe regions on each side of the p-type region. After annealing and the deposition of a metal contact on each central rectangle and both border stripes, solder regions are deposited on each metal region. Finally, the wafer is cut apart to separate each LD into a separate chip, and each chip is flipped over and soldered to a lead frame. The substrate faces upward, and heat generated during laser operation can flow directly from the active device into the lead frame. External cooling such as a thermoelectric cooler may be included in the lead frame.

FIG. 7A shows a top-view, FIG. 7B shows a narrow end view and FIG. 7C shows a cross-sectional view of a nitride-base LD 36 made as described above. FIG. 7A shows a centrally disposed positive metal contact 16 and peripherally disposed negative metal contacts 14 disposed atop the topmost layer 12 of the LD device. FIG. 7B shows a narrow end view and FIG. 7C shows a cross-sectional view of the LD device showing the substrate 26 having disposed thereon a series of lower layers 20 (which are shown as one layer for convenience) and topmost layer 12. The topmost and lower layers have been ion-implanted with n-type dopants forming two parallel n-type doped regions 18 which extend horizontally along the edges of the device and vertically through the topmost layer 12 into the lower layers 20. An elongated ion-implanted p-type region 22 has been formed in topmost layer at the central region of the device. Negative metal contacts 14 are disposed upon the n-type regions. As shown by the arrows in FIGS. 7A and 7C, and by the star in FIG. 7B, coherent light generated upon applying energy to the device is emitted from one narrow edge of the laser. This is shown more clearly in FIG. 8.

Figure 8:
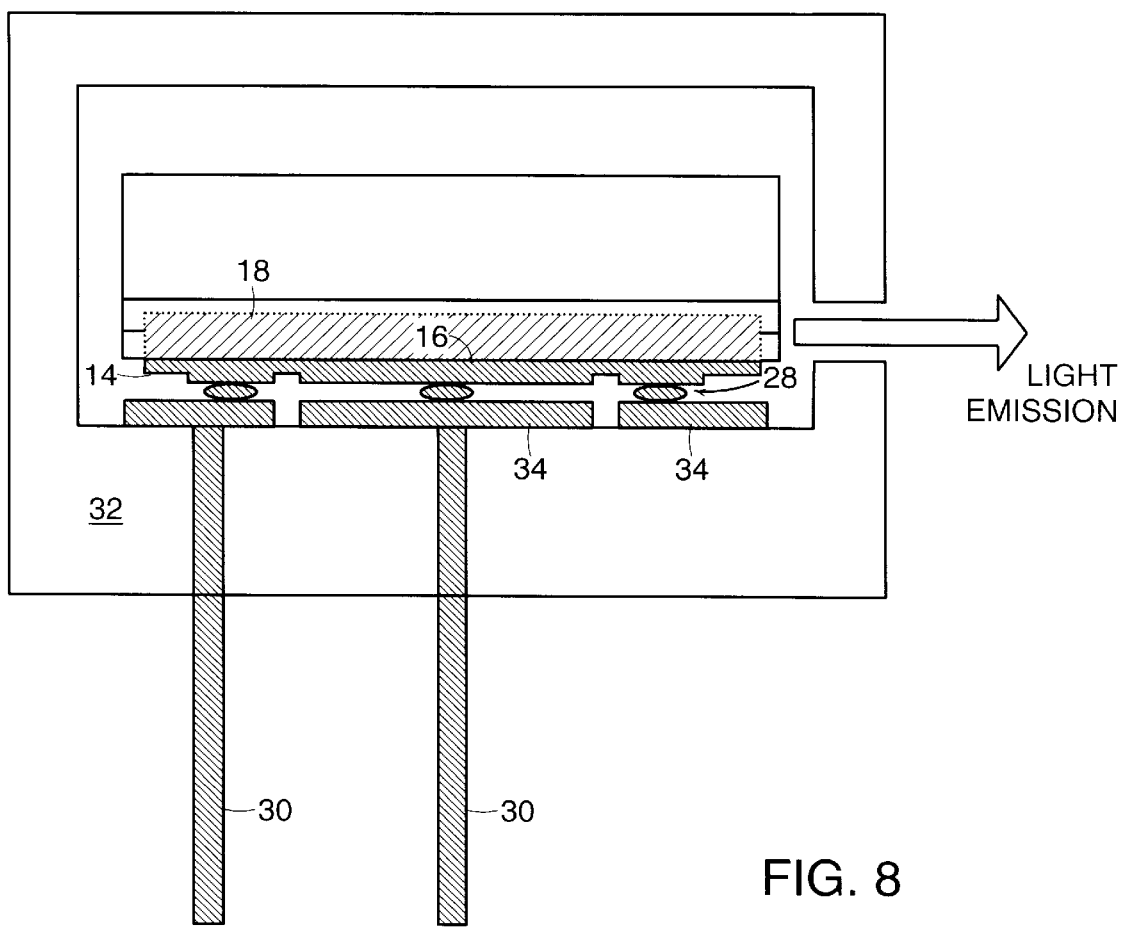
FIG. 8 is a cross-sectional view diagram showing a laser diode which has been flipped over and mounted on a lead frame with the substrate facing up for effective cooling of the device.

FIG. 8 shows a side view of the LD 36 disposed within lead frame 32. As shown in FIG. 8, positive metal contact 16 and negative metal contacts 14 are electrically coupled via solder bonds 28 to metal stripes 34 which are disposed on a lead frame 32. At least two of the metal stripes 34 are electrically connected to leads 30. When electrical energy is applied through leads 30, the resulting electrical current causes coherent light to be emitted from a narrow side of the LD through a hole in frame 32 as shown by the arrow in FIG. 8.

Figure 9:
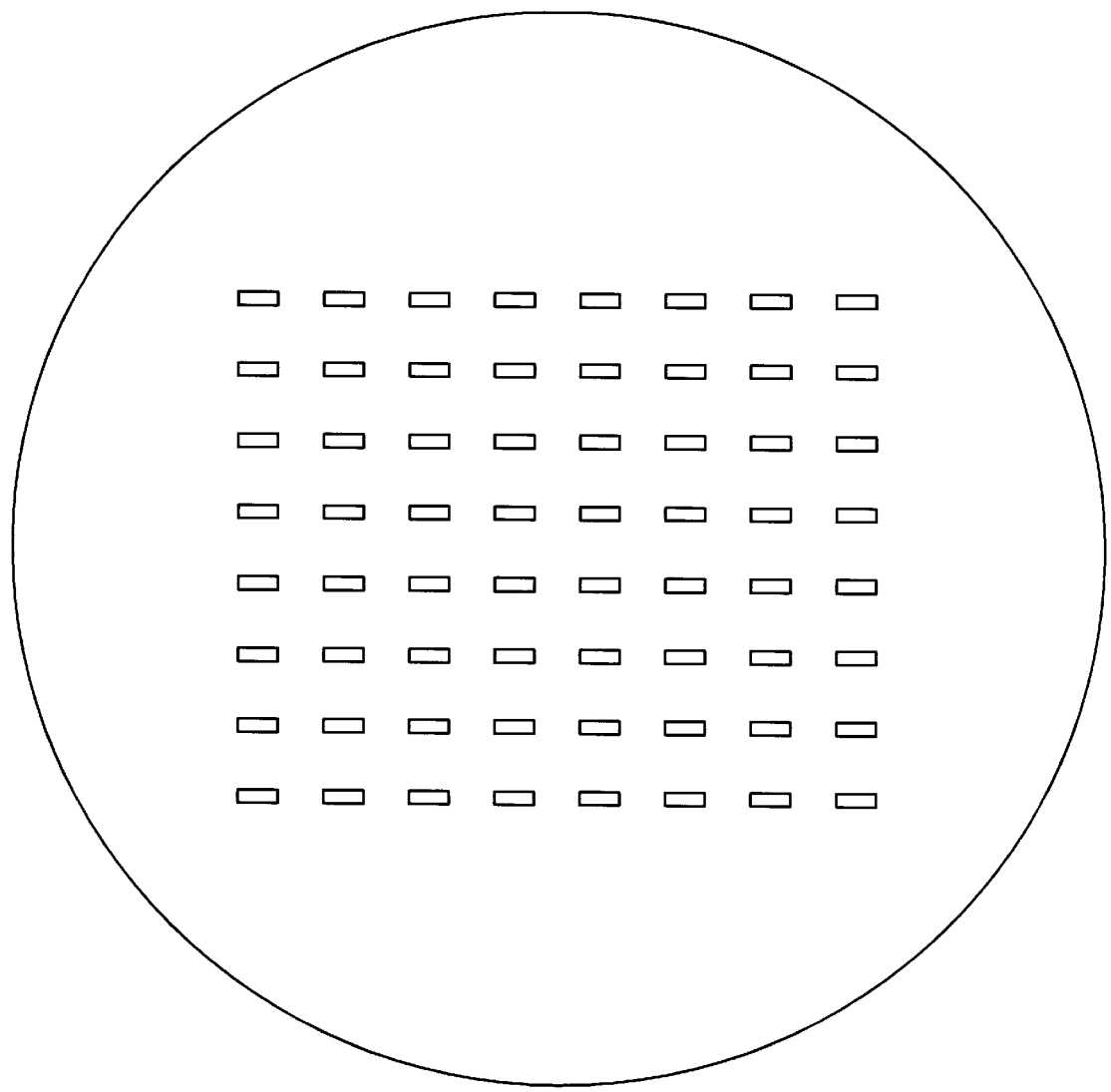
FIG. 9 shows a mask suitable for defining the p-type implant region for an LDD.
Figure 10:
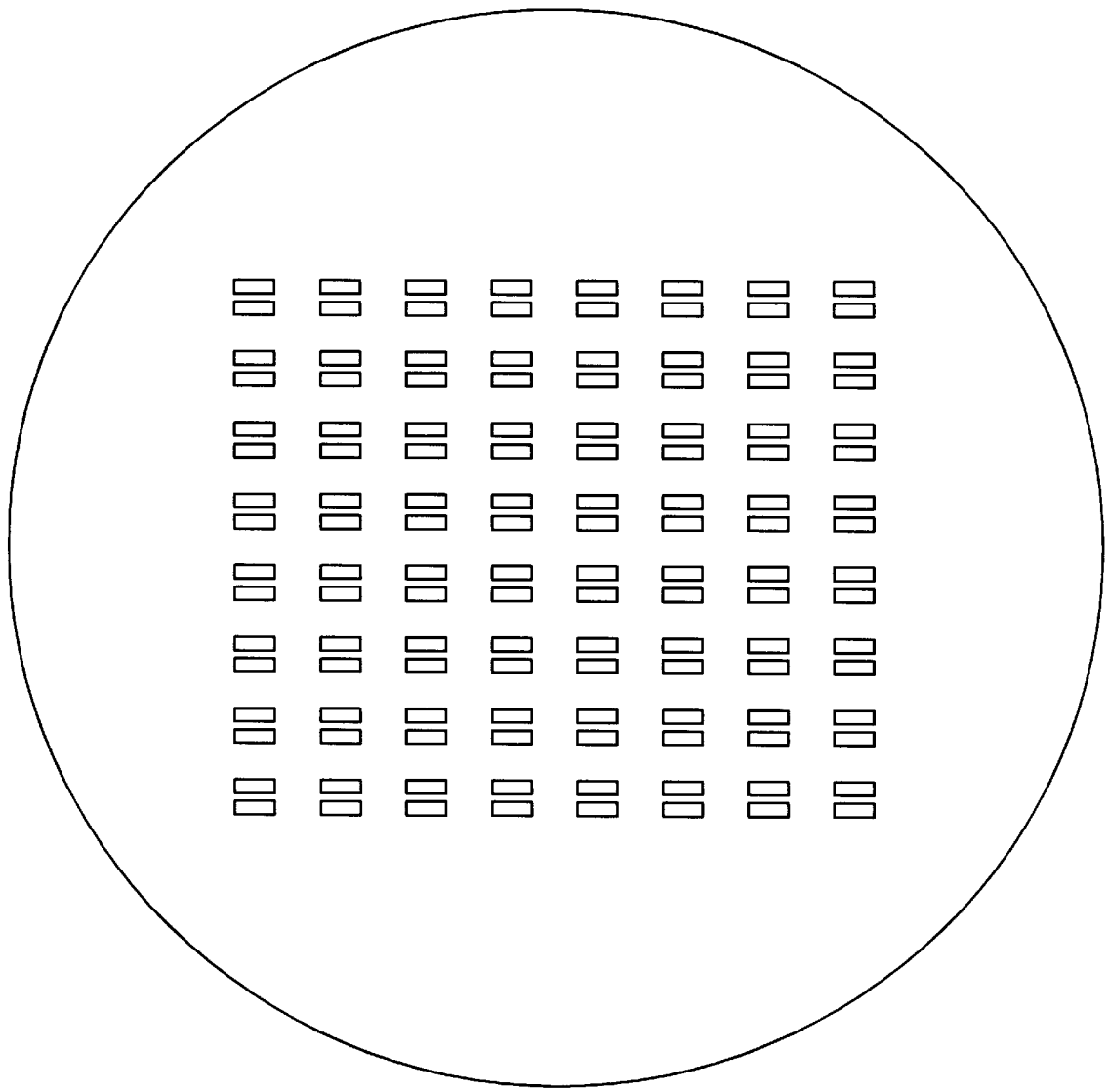
FIG. 10 shows a mask suitable for defining the n-type implant region for an LDD.

As stated above, during the ion implantation step, the wafer must be properly masked to ensure that the implanted species only enter certain selected regions of the wafer. An example of a mask suitable for defining the p-type implant region for an LD is shown in FIG. 9. A mask suitable for defining the n-type implant region for an LD is shown in FIG. 10.

The invention will be more readily understood by reference to the following examples, which are not intended to be limiting in any way.

EXAMPLE 1

The method for preparing a nitride-based LED starts with a sapphire wafer on which has been grown a first layer of GaN about 1 µm thick which has been doped during growth with silicon at a concentration between about $1 \times 10^{18}$ cm$^{-3}$ and $5 \times 10^{18}$ cm$^{-3}$. This layer forms the rear Si-doped n-type layer. This is followed by growing an active region. The active region consists of a layer or layers of an alloy of GaN with InN to control the wavelength of the emitted light. The active region in nitride devices is about 0.25 microns thick. Finally there is grown an undoped region about 0.3–0.5 µm thick to form the top surface region.

Using a shadow mask of the type shown in FIG. 4, Si ions were implanted through the active region to form a contact to the rear Si-doped layer. Implantations were performed using an Eaton Model 3206 ion implanter which features an automated wafer handling facility. The original as-received 2" diameter sapphire wafers with nitride films grown thereupon were attached to silicon wafers which act as carriers for introducing the wafers into the end zone of the ion implanter. The silicon wafer with the attached GaN samples was loaded into the entry port of the implanter. Silicon ions were implanted into the masked wafer according to the following protocol. For the first implant, the beam energy was 195 keV and the silicon dose was $6 \times 10^{13}$ ions/cm$^2$. For the second implant, the beam energy was 100 keV and the silicon dose was $1.85 \times 10^{13}$ ions/cm$^2$. For the third dose the beam energy was 50 keV and the silicon dose was $9.5 \times 10^{12}$ ions/cm$^2$. Calculations using the Profile Code indicate that these doses should give a silicon concentration of approximately $3.7 \times 10^{18}$ cm$^{-3}$ over a thickness of 280 nm.

At this point, a capping (protective) layer of AlN was applied to the wafer and the wafer was annealed in order to test the n-type layer. Ordinarily, a capping layer would not be applied, nor would an annealing step be performed, at this point during the process, but it was necessary in order to perform the tests to ensure that the n-type dopants were properly applied. The protective layer was applied by sputtering using a DC magnetron sputtering machine based on a 2" sputtering gun. A 2" aluminum target was used with a plasma consisting of argon+nitrogen. It is preferred to employ the bipolar pulsed direct current method for biasing the aluminum cathode to prevent charging at the surface. The conditions that can be used for forming AlN capping layers include an applied power of about 100 W, a total chamber pressure of about 20 mtorr, an argon partial pressure of about 10 mtorr, and a nitrogen partial pressure of about 10 mtorr. The AlN film growth rate was about 0.2 nm/sec. The films were transparent and highly resistive.

The capped sample was placed in an annealing station consisting of a 36" long Lindberg tube furnace that can produce temperatures up to about 1200° C. A 2" diameter quartz tube is situated in the furnace and ultrapure nitrogen flows through it at a rate of about 4 L/min. There was a load-lock, so samples were inserted and removed from the heated section in very short time periods (2 min or less) without exposing heated samples to air. The sample was annealed in flowing N$_2$ for 2 minutes at 1165° C., and it was allowed to cool to room temperature. Then indium contacts were placed on the four corners. A standard Hall Effect measurement on the van der Pauw style specimen gave a carrier concentration n=$2 \times 10^{18}$ cm$^{-3}$ with resistivity P=0.029 Ω-cm and mobility µ=106 cm$^2$/V-s.

To form an electronic junction diode, p-type ions were implanted in the central portion of the devices using a mask of the type shown in FIG. 3. Magnesium (Mg) was implanted in the central square. As a co-activator, phosphorus (P) of equal dose was implanted in the same area as the magnesium. The implantation conditions for Mg were as follows. For the first Mg implant, the beam energy was 90 keV and the dose was $6 \times 10^{14}$ ions/cm$^2$. For the second Mg implant, the beam energy was 30 keV and the dose was $1.5 \times 10^{14}$ ions/cm$^2$. For the first P implant, the beam energy was 115 keV and the dose was $6 \times 10^{14}$ ions/cm$^2$. For the second P implant the beam energy was 40 keV and the dose was $1.5 \times 10^{14}$ ions/cm$^2$.

After capping with AlN as described above, the wafer was annealed in the furnace at 1175° C. in flowing nitrogen for 20 minutes. After cooling to room temperature, the wafer was placed in a 1 M aqueous solution of KOH maintained at 65° C. which dissolved the AlN capping layer. A thermoelectric probe indicated that the regions which had been implanted with Mg+P were now p-type conductivity.

Figure 5:
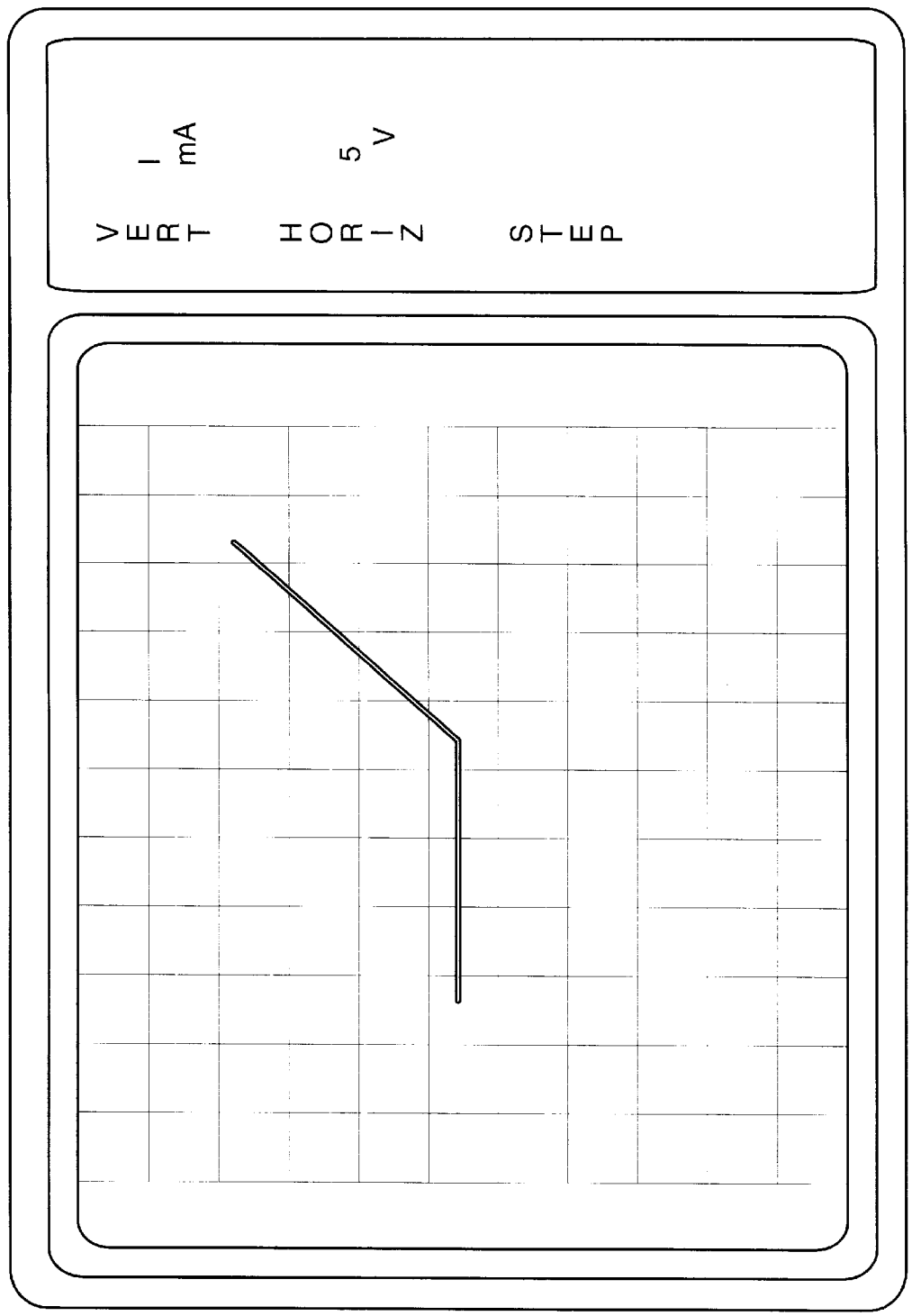
FIG. 5 is a graph showing the measured electrical characteristics of a blue LED created by ion implantation.
Figure 6:
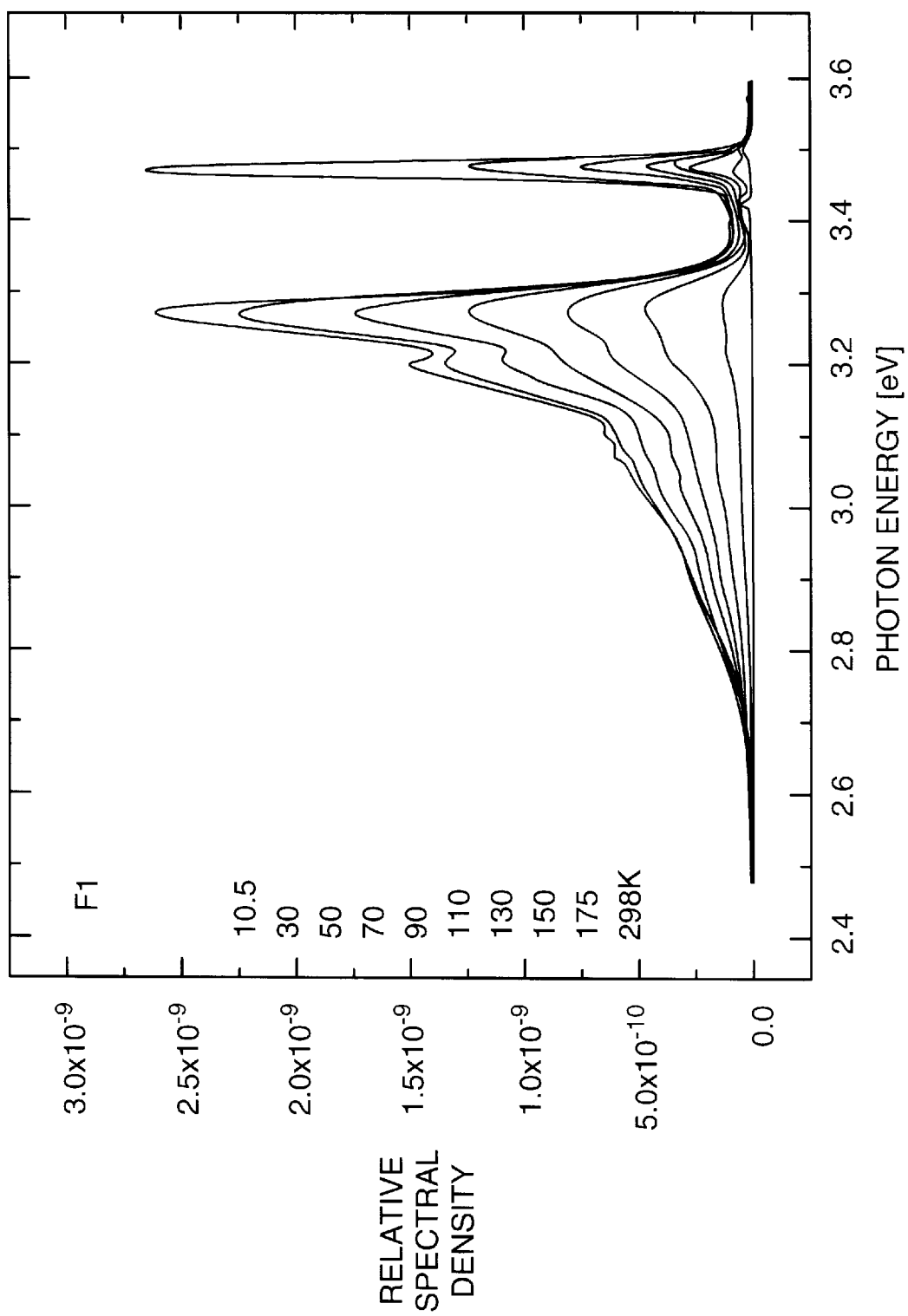
FIG. 6 is a graph showing the light emission spectrum of an LED created by ion implantation.

Temporary contacts made from indium were applied to both the n-type and the p-type regions of a particular device. Indium typically would not be used as permanent contact material. Wire probes were placed on each of a pair of dots and a voltage was applied. It was found that a current only flowed when the probe to the region that had been implanted with Mg+P was made to be electrically positive. A current-voltage characteristic is shown in FIG. 5. Under these forward bias conditions, the sample was found to emit blue light. An example of the wavelength dependence of the luminescence that was emitted by this sample after implantation and annealing is shown in FIG. 6.

Because both contacts are on the surface of the device, it was possible to flip the chip over. Indium contacts were deposited on the surface as described above. Then the sample was flipped over and assembled to a lead frame which contained two indium solder bump bonding pads. Upon application of electrical energy, a blue light emission was observed through the sapphire substrate.

Equivalents

Those skilled in the art will be able to ascertain many equivalents to the specific embodiments described herein. Such equivalents are intended to be encompassed within the following claims.

I claim:

1. A method for producing a semiconductor device suitable for use as a light-emitting diode or laser diode comprising
   a. providing a transparent substrate capable of supporting single crystal nitride growth having disposed sequentially thereon:
      a first layer of an n-type doped first nitride compound,
      at least one additional layer which may be doped or undoped comprising a second nitride compound or a nitride alloy, and
      a final topmost layer of an undoped third nitride compound;
   b. applying an n-type dopant to a peripheral portion of the topmost layer by ion implantation under conditions such that the n-type dopant permeates through the topmost layer and at least a portion of the additional layer or thereby forming an implanted n-type region; and
   c. applying a p-type dopant to a central region of the top-most layer by ion implantation under conditions such that the p-type dopant permeates through the topmost layer thereby forming a p-type implanted region.

2. The method of claim 1 wherein the substrate is selected from the group consisting of sapphire, spinel and silicon carbide.

3. The method of claim 2 wherein the substrate is sapphire.

4. The method of claim 1 wherein said first layer is selected from the group consisting of gallium nitride, aluminum nitride, indium nitride, thallium nitride, scandium nitride, yttrium nitride, lanthanum nitride, and any alloys, mixtures and combinations of these.

5. The method of claim 1 wherein said additional layer is selected from the group consisting of gallium nitride, aluminum nitride, indium nitride, thallium nitride, scandium nitride, yttrium nitride, lanthanum nitride, and any alloys, mixtures and combinations of these.

6. The method of claim 1 wherein the topmost layer comprises undoped gallium nitride or an alloy of indium nitride and gallium nitride.

7. The method of claim 1 wherein the n-type dopant is selected from the group consisting of silicon, germanium, oxygen, sulfur and combinations thereof.

8. The method of claim 1 wherein the p-type dopant is selected from the group consisting of beryllium, magnesium, calcium, carbon, zinc and combinations thereof.

9. The method of claim 1 further comprising the step of applying metal contacts to the surfaces of the n-type and the p-type implanted regions after step (c) thereby forming reflective surfaces capable of reflecting light through the substrate.

10. The method of claim 9 further comprising the step of disposing the device on a lead frame with the transparent substrate facing upward to allow unobstructed emission of the light.

11. The method of claim 1 wherein the device comprises a square diode.

12. The method of claim 1 wherein the device comprises a rectangular diode having two broad sides and two narrow sides.

13. The method of claim 12 further comprising the step of applying a dielectric mirror at each narrow side of the device, and disposing the device onto a lead frame with the substrate facing upwards.

14. The method of claim 1 further comprising the step of annealing the device in an inert nitrogen gas at a temperature of at least about 1000° C.

15. The method of claim 10 further comprising the step of bonding the device to a chip carrier.

16. A method for producing a bright, high-yield green or blue LED comprising the steps of
   a. providing a sapphire substrate having disposed sequentially thereon:
      a first layer of n-type nitride selected from the group consisting of gallium nitride, aluminum nitride, indium nitride, thallium nitride, scandium nitride, yttrium nitride, lanthanum nitride, and any alloys, mixtures and combinations of these,
      at least one additional layer which may be doped or undoped comprising a nitride compound selected from the group consisting of gallium nitride, aluminum nitride, indium nitride, thallium nitride, scandium nitride, yttrium nitride, lanthanum nitride, and any alloys, mixtures and combinations of these, and
      a final topmost layer of undoped gallium nitride or an alloy of indium nitride and gallium nitride;
   b. producing a conducting channel which permeates from the topmost layer to the first layer by ion implantation of a donor selected from the group consisting of silicon, germanium, sulfur and oxygen to a peripheral region of the LED thereby forming an n-type implanted region in a ring or border pattern around the circumference of the LED;
   c. producing a p-type surface layer by ion implantation of an acceptor ion selected from the group consisting of beryllium, magnesium, calcium, carbon, and zinc to a central region of the LED thereby forming a p-type implanted region located within the n-type region;

d. annealing the implanted device in flowing nitrogen gas at a temperature of at least about 1000° C.;

e. disposing two metal contacts on the surfaces of the n-type and the p-type implanted regions thereby forming a reflective surface capable of reflecting light through the substrate; and f. bonding the device to a chip carrier.

17. The method of claim 16 further comprising the step of forming on the LED after step (c) a protective capping layer comprising a nitride material.

18. A method for producing a high intensity, high-yield, green, blue or ultraviolet laser diode comprising the steps of:

a. providing a sapphire substrate having disposed thereon:

a first layer of n-type nitride selected from the group consisting of gallium nitride, aluminum nitride, indium nitride, thallium nitride, scandium nitride, yttrium nitride, lanthanum nitride, and any alloys, mixtures and combinations of these, at least one additional layer which may be doped or undoped comprising a nitride compound selected from the group consisting of gallium nitride, aluminum nitride, indium nitride, thallium nitride, scandium nitride, yttrium nitride, lanthanum nitride, and any alloys, mixtures and combinations of these, and final topmost layer of undoped gallium nitride or an alloy of indium nitride and gallium nitride;

b. producing a conducting channel which permeates from the topmost layer to the first layer by ion implantation of a donor selected from the group consisting of silicon, germanium, sulfur and oxygen to a peripheral region of the diode thereby forming an n-type implanted region, wherein the diode has a rectangular shape having long and narrow sides, and wherein the channel forms two parallel continuous bands along the long sides;

c. producing a p-type surface layer by ion implantation of an acceptor ion selected from the group consisting of beryllium, magnesium, calcium, carbon, and zinc to a central region of the device thereby forming a p-type implanted region located centrally between the bands of the n-type regions;

d. annealing the implanted device in flowing inert gas at a temperature of at least about 1000° C.;

e. disposing two metal contacts on the surfaces of the n-type and p-type implanted regions thereby forming electrical contacts;

f. applying dielectric mirrors at each narrow side of the rectangular diode; and g. bonding the device to a chip carrier.

19. The method of claim 18 further comprising the step of forming a protective capping layer comprising a nitride material on the diode after step (c).

20. An LD produced according to the method of claim 18.

* * * * *